(12) United States Patent
Yamashita

(10) Patent No.: US 10,636,930 B2
(45) Date of Patent: Apr. 28, 2020

(54) SPAD IMAGE SENSOR AND ASSOCIATED FABRICATING METHOD

(71) Applicant: TAIWAN SEMICONDUCTOR MANUFACTURING COMPANY LTD., Hsinchu (TW)

(72) Inventor: Yuichiro Yamashita, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/896,579

(22) Filed: Feb. 14, 2018

(65) Prior Publication Data

US 2019/0103504 A1    Apr. 4, 2019

Related U.S. Application Data

(60) Provisional application No. 62/566,161, filed on Sep. 29, 2017.

(51) Int. Cl.
*H01L 31/107* (2006.01)
*H01L 27/144* (2006.01)
(Continued)

(52) U.S. Cl.
CPC ........ *H01L 31/107* (2013.01); *H01L 27/1443* (2013.01); *H01L 27/1461* (2013.01);
(Continued)

(58) Field of Classification Search
None
See application file for complete search history.

(56) References Cited

U.S. PATENT DOCUMENTS

| 2010/0019295 A1* | 1/2010 | Henderson ............ H01L 31/107 257/292 |
| 2011/0079869 A1* | 4/2011 | Mazzillo ........... H01L 27/14643 257/443 |

(Continued)

FOREIGN PATENT DOCUMENTS

| KR | 101765990 | 8/2017 |
| TW | 201611235 A | 3/2016 |
| TW | 201724488 A | 7/2017 |

OTHER PUBLICATIONS

Perenzoni, M., Panchen, L., & Stoppa, D. (2016). Compact SPAD-Based Pixel Architectures for Time-Resolved Image Sensors. Sensors, 16(12), 745. doi:10.3390/s16050745.
(Continued)

*Primary Examiner* — Steven B Gauthier
(74) *Attorney, Agent, or Firm* — WPAT, P.C., Intellectual Property Attorneys; Anthony King

(57) ABSTRACT

A single photon avalanche diode (SPAD) image sensor is disclosed. The SPAD image sensor includes: a substrate having a front surface and a back surface; wherein the substrate includes a sensing region, and the sensing region includes: a common node heavily doped with dopants of a first conductivity type, the common node being within the substrate and abutting the back surface of the substrate; a sensing node heavily doped with dopants of a second conductivity type opposite to the first conductivity type, the sensing node being within the substrate and abutting the front surface of the substrate; and a first layer doped with dopants of the first conductivity type between the common node and the sensing node.

20 Claims, 16 Drawing Sheets

(51) Int. Cl.
  *H01L 31/0232* (2014.01)
  *H01L 27/146* (2006.01)
  *H01L 29/06* (2006.01)
  *H01L 31/02* (2006.01)
  *H01L 31/18* (2006.01)

(52) U.S. Cl.
  CPC .... *H01L 27/1463* (2013.01); *H01L 27/14634* (2013.01); *H01L 27/14636* (2013.01); *H01L 27/14643* (2013.01); *H01L 27/14649* (2013.01); *H01L 29/0646* (2013.01); *H01L 31/02027* (2013.01); *H01L 31/02327* (2013.01); *H01L 31/1804* (2013.01); *H01L 27/1464* (2013.01)

(56) References Cited

U.S. PATENT DOCUMENTS

| | | | | |
|---|---|---|---|---|
| 2014/0217264 A1* | 8/2014 | Shepard | ............ | G01N 21/6458 250/208.1 |
| 2014/0291481 A1* | 10/2014 | Zhang | ................... | H04N 5/361 250/208.1 |
| 2015/0115131 A1 | 4/2015 | Webster et al. | | |
| 2015/0200222 A1* | 7/2015 | Webster | ................ | H01L 31/107 250/208.1 |
| 2015/0200314 A1 | 7/2015 | Webster | | |
| 2017/0176184 A1* | 6/2017 | Lee | ........... | G01C 3/02 |
| 2017/0186798 A1 | 6/2017 | Yang et al. | | |
| 2018/0308881 A1* | 10/2018 | Hynecek | ............... | H01L 27/146 |

OTHER PUBLICATIONS

Notice of Allowance dated Apr. 19, 2019 by Taiwan Intellectual Property Office for counterpart application No. 107120207.
Search Report dated Jun. 12, 2018 by Taiwan Intellectual Property Office for counterpart application No. 107120207.
English Abstract Translation of Foreign Patent Document TW201611235A.
English Abstract Translation of Foreign Patent Document TW201724488A.
Office action from Korean counterpart 10-2018-0113193 dated Jan. 12, 2020.
US2014291481A1 is the English counterpart for KR101765990.

* cited by examiner

SPAD IMAGE SENSOR AND ASSOCIATED FABRICATING METHOD

CROSS REFERENCE TO RELATED APPLICATIONS

This application claims the benefit of U.S. provisional application 62/566,161, filed on Sep. 29, 2017, which is incorporated by reference in its entirety.

BACKGROUND

Digital cameras and optical imaging devices employ image sensors. Image sensors convert optical images to digital data that may be represented as digital images. An image sensor typically includes an array of pixel sensors, which are unit devices for the conversion of an optical image into electrical signals. Pixel sensors often manifest as charge-coupled devices (CCDs) or complementary metal oxide semiconductor (CMOS) devices.

Avalanche photodiodes (APD) are solid devices that are compatible with traditional CMOS devices. An avalanche process can be triggered when a reverse biased p-n junction receives additional carriers, such as carriers generated by incident radiation. For example, in order to detect radiations with low intensities, the p-n junction is biased above its breakdown voltage, thereby allowing a single photon-generated carrier to trigger an avalanche current that can be detected. Image sensor operated in this mode is known as a single photon avalanche diode (SPAD) image sensor, or a Geiger-mode avalanche photodiodes or G-APD.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
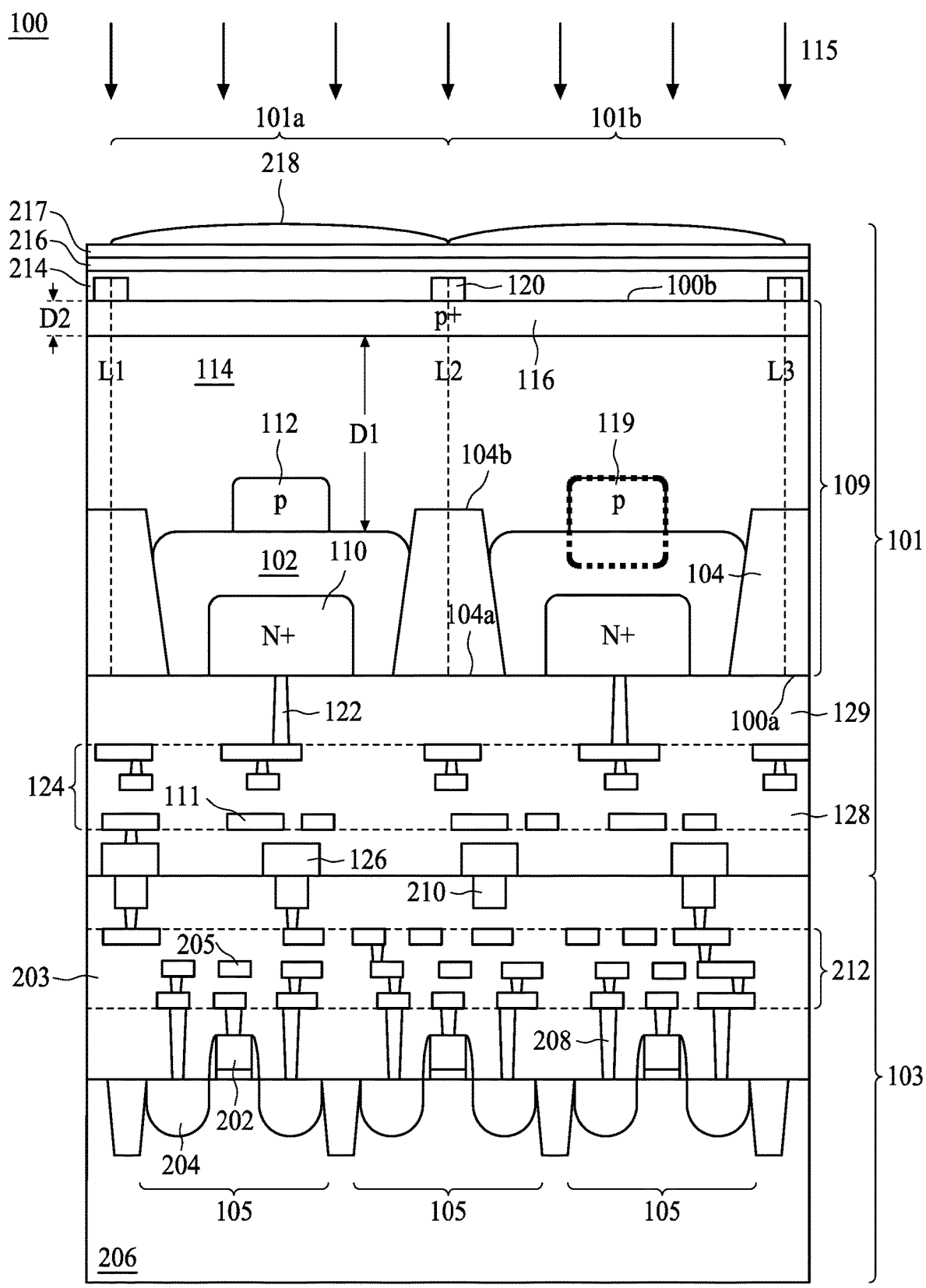
FIG. 1 is a diagram illustrating a cross-sectional view of a SPAD image sensor including a CMOS (complementary metal-oxide-semiconductor) chip and an imaging chip bonded together in accordance with a first embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

A SPAD (single photon avalanche diode) image sensor can detect incident radiation with very low intensities (e.g., a single photon). The SPAD image sensor includes a plurality of SPAD cells arranged in an array. The SPAD cells respectively include a p-n junction, a quench circuit and a read circuit. The p-n junction operates at a reverse bias well above its breakdown voltage. During operation, photogenerated carriers move to a depletion region (i.e., a multiplication region) of the p-n junction and trigger an avalanche effect such that a signal current can be detected. The quench circuit is used to cut off the avalanche effect and reset the SPAD cell. The read circuit receives and transmits the signal current.

An existing planar SPAD image sensor is configured to include a guard ring between a sensing node and a common node. Without the guard ring to relax the electric field in the vicinity between the sensing node and the common node, an edge breakdown may occur before a breakdown occurs at a photodetective portion. If the edge breakdown occurs first, it is not possible to sufficiently raise the electric field intensity at the photodetective portion because the increase in voltage only causes current to flow. In particular, if an edge breakdown occurs at a voltage lower than the breakdown voltage at the photodetective portion, a sufficient multiplication factor cannot be obtained at the photodetective portion because the electric field intensity at the photodetective portion cannot be raised sufficiently and sufficiently high photodetective sensitivity cannot be ensured, therefore, it is not possible to sufficiently function as a SPAD as a result. Further, if an edge breakdown has occurred, excessive noises are caused to occur as a result, and this also raises a problem.

However, the guard ring consumes a large area and therefore limits the fill factor, a parameter characterizing a ratio of photodiode area to total pixel area. As a result, shrinking a pixel area and keeping performance is hard to be achieved for existing SPAD image sensors. The present disclosure relates to a SPAD image sensor consumes a smaller area without sacrificing performance compared to the existing SPAD image sensor.

FIG. 1 is a diagram illustrating a cross-sectional view of a SPAD image sensor 100 including a CMOS (complementary metal-oxide-semiconductor) chip 103 and an imaging chip 101 bonded together in accordance with a first embodiment of the present disclosure. The SPAD image sensor 100 includes an array of pixels 101a to 101b as shown in FIG. 1 for illustrative purpose. For many instances, the SPAD image sensor 100 may include more than two pixels. The CMOS chip 103 has a plurality of active devices 105. In some embodiments, the CMOS chip 103 includes an interconnect structure 212 disposed over a substrate 206. In some embodiments, the interconnect structure 212 includes a plurality of metal layers 205 disposed within an inter-layer dielectric (ILD) layer 203. The active devices 105 are disposed at least in the substrate 206. The imaging chip 101 includes an interconnect structure 124 disposed between the interconnect structure 212 of the CMOS chip 103 and a substrate 109 of the imaging chip 101. The interconnect structure 124 includes a plurality of metal layers 111 disposed within an ILD layer 128.

Each of the pixels 101a and 101b includes a SPAD cell disposed within the substrate 109. The substrate 109 includes a front surface 100a facing the interconnect structure 124 and a back surface 100b facing opposite to the interconnect structure 124. A dielectric layer 129 is between the substrate 109 and the interconnect structure 124. Each two adjacent SPAD cells are separated by a trench isolation 104. In some embodiments, the trench isolation 104 extends from the front surface 100a toward the back surface 100b. In many instances, the trench isolation 104 may have a trapezoidal profile as shown in FIG. 1. However, this is not a limitation of the present disclosure. In many instances, the trench isolation 104 may have an elongated rectangular profile. A first surface 104a of the trench isolation 104 is level with the front surface 100a, and a second surface 104b of the trench isolation 104 is in the substrate 109 and does not in contact with or overlap the back surface 100b.

The trench isolation 104 may be formed of a dielectric material such as an oxide (silicon oxide, for example), a nitride (silicon nitride or silicon oxynitride, for example), a low-k dielectric, and/or another suitable dielectric material.

The substrate 109 may include a first layer 114 doped with dopants of a first conductivity type, e.g., p type. A dopant concentration of the first layer 114 of the first conductivity type may be at a level of about $1e16/cm^3$. The first layer 114 encompasses at least a portion of the trench isolation 104 neighboring to the back surface 104b of the trench isolation 104. The substrate 109 may further include a second layer 102 in each of the pixels 101a and 101b. The second layer 102 may be doped with dopants of a second conductivity type, e.g., n type, opposite to the conductivity type of the first layer 114. A dopant concentration of the second layer 102 may be at a level of about $1e17/cm^3$ to about $1e19/cm^3$. The second layer 102 is between the first layer 114 and the front surface 100a of the substrate 109. In particular, the second layer 102 immediately abuts the front surface 100a of the substrate 109 and the trench isolation 104. For many instances, the second layer 102 of the pixels 101a is separated from the second layer 102 of the pixels 101b by the trench isolation 104, and the second layer 102 of the pixels 101a is not in contact with the second layer 102 of the pixels 101b. In some embodiments, the second layer 102 may be omitted, i.e. replaced by the first layer 114.

Each of the pixels 101a and 101b further includes a sensing node 110 heavily doped with dopants of the second conductivity type, e.g., n type, the same to the conductivity type of the second layer 102. A dopant concentration of the sensing node 110 may be heavier than the dopant concentration of the second layer 102. In some embodiments, a ratio of the dopant concentration of the sensing node 110 to the dopant concentration of the second layer 102 may be in a range from about 10 to about 1000. In an embodiment, the dopant concentration of the sensing node 110 may be at a level of about $1e20/cm^3$. The sensing node 110 is formed in the substrate 109 and immediately abuts the front surface 100a of the substrate 109. In particular, the sensing node 110 is formed within the second layer 102 and is encompassed by the second layer 102. In other words, the sensing node 110 is separated from the first layer 114 by the second layer 102. Through a contact plug 122, the sensing node 110 is able to be coupled to the active devices 105 of the CMOS chip 103 via the interconnect structure 124 and the ILD layer 203. In some embodiments, the active devices 105 may include active quench circuit to stop avalanche effect and reset bias of the SPAD cells. The active devices 105 may also include read circuit and other control or logic circuits. For example, the active devices 105 may include a transistor device having a gate structure 202 and source/drain regions 204. The sensing node 110 can be coupled to a source/drain region 204 of the transistor through a contact plug 208.

Each of the pixels 101a and 101b may further includes a third layer 112 doped with dopants of the first conductivity type, e.g., p type, the same to the conductivity type of the first layer 114. A dopant concentration of the third layer 112 may be heavier than the dopant concentration of the first layer 114. In some embodiments, a ratio of the dopant concentration of the third layer 112 to the dopant concentration of the first layer 114 may be in a range from about 1 to about 100. In an embodiment, the dopant concentration of the third layer 112 may be at a level of about $1e17/cm^3$. The third layer 112 is formed in the first layer 114 and immediately abuts the second layer 102. In particular, the third layer 112 is formed within the first layer 114 and is encompassed by the first layer 114. In particular, the third layer 112 is separated from the sensing node 110 by the second layer 102.

A common node 116 is formed as a layer covering the first layer 114 neighboring to the back surface 100b of the substrate 109. For many instances, the common node 116 is at the back surface 100b of the substrate 109 and has a thickness D2 less than about 0.5 µm. The common node 116 may be heavily doped with dopants of the first conductivity type, e.g., p type, the same to the conductivity type of the first layer 114 and the third layer 112. A dopant concentration of the common node 116 may be heavier than the dopant concentration of the first layer 114 and the third layer 112. In some embodiments, a ratio of the dopant concentration of the common node 116 to the dopant concentration of the third layer 112 may be in a range from about 10 to about 1000. In an embodiment, the dopant concentration of the common node 116 may be at a level of about 5e18/cm$^3$. In particular, the common node 116 is separated from second layer 102 by a distance D1 with respect to a vertical direction perpendicular to a direction of the front surface or the hack surface of the substrate. In some embodiments, the distance D1 may be greater than about 1 µm.

A grid structure 120 is on the common node 116. In some embodiments, the grid structure 120 may immediately abut the common node 116. In other words, the grid structure 120 may be in physical contact with the back surface 100b of the substrate 109. The grid structure 120 may include metal grid lines. In accordance with an embodiment, the metal grid lines are comprised of copper, aluminum, tantalum, titanium nitride, combinations thereof or the like. Grid openings are formed between metal grid lines. The metal grid lines overlap at least a portion of the trench isolation 104 and surround each of the pixels 101a and 101b from a top view. Each of grid openings is over and aligned to one of the pixels.

One of the purposes of the grid structure 120 is to collect the holes absorbed by the common node 116. The holes may be drained to a reference voltage node or coupled to the active devices 105 of the CMOS chip 103 through a through substrate via (TSV) and contact plugs at a peripheral region in the imaging chip 101 around the pixels 101a and 101b. From a cross-sectional view of the SPAD image sensor 100 shown in FIG. 1, the grid structure 120 has a rectangular profile including three metal grid lines. A center of each of the metal grid lines of the grid structure 120 overlaps a center of each of the corresponding trench isolations 104 as indicated by dashed lines L1 to L3 in FIG. 1. As such, another one of the purposes of the grid structure 120 may be prevention of crosstalk between adjacent pixels.

According to various embodiments of the present disclosure, a desired breakdown region 119 is depicted in FIG. 1 around an interface of the third layer 112 and the second layer 102. Although the desired breakdown region 119 is only illustrated in the pixel 101b, it is within the contemplated scope of the present disclosure that other pixels such as the pixel 101a also include desired breakdown region like the pixel 101b. Since a distance between the third layer 112 and the second layer 102 is shorter than the vertical distance D1 between the common node 116 and the second layer 102, an edge breakdown is less likely to happen compared to the breakdown occurring at the desired breakdown region 119 other words, the vertical distance D1 between the common node 116 and the second layer 102 provides a compensation of a function of a guard ring. By adjusting the position of the common node 116 from the front surface 100a of the substrate 109 to the back surface 100b of the substrate 109, the guard ring originally at the front surface 100a and between the sensing node 110 and the common node 116 can be omitted. Thus the fill factor of the present disclosure can be improved. When the breakdown successfully happens at the breakdown region 119, electrons flow to the sensing node 110 and are collected by the sensing node 110, and holes are absorbed by the common node 116. In an embodiment, the common node 116 and the grid structure 120 are shared by all the pixels.

In some embodiments, the imaging chip 101 and the CMOS chip 103 are bonded together by a hybrid bond including a metal-to-metal bond and a dielectric-to-dielectric bond. The metal to metal bond (e.g. a diffusion bond) can be between a top metal layer 126 of the plurality of metal layers 111 and a top metal layer 210 of the plurality of metal layers 205. The dielectric-to-dielectric bond can be between the ILD layer 128 and the ILD layer 203 such that the ILD layer 128 and the ILD layer 203 are in direct contact with one another. The top metal layers 126 and 210 function as a pair of bonding pads and can include re-distribution layers (RDLs). In some embodiments, the dielectric-to-dielectric bond is an oxide-to-oxide bond.

Figure 5:
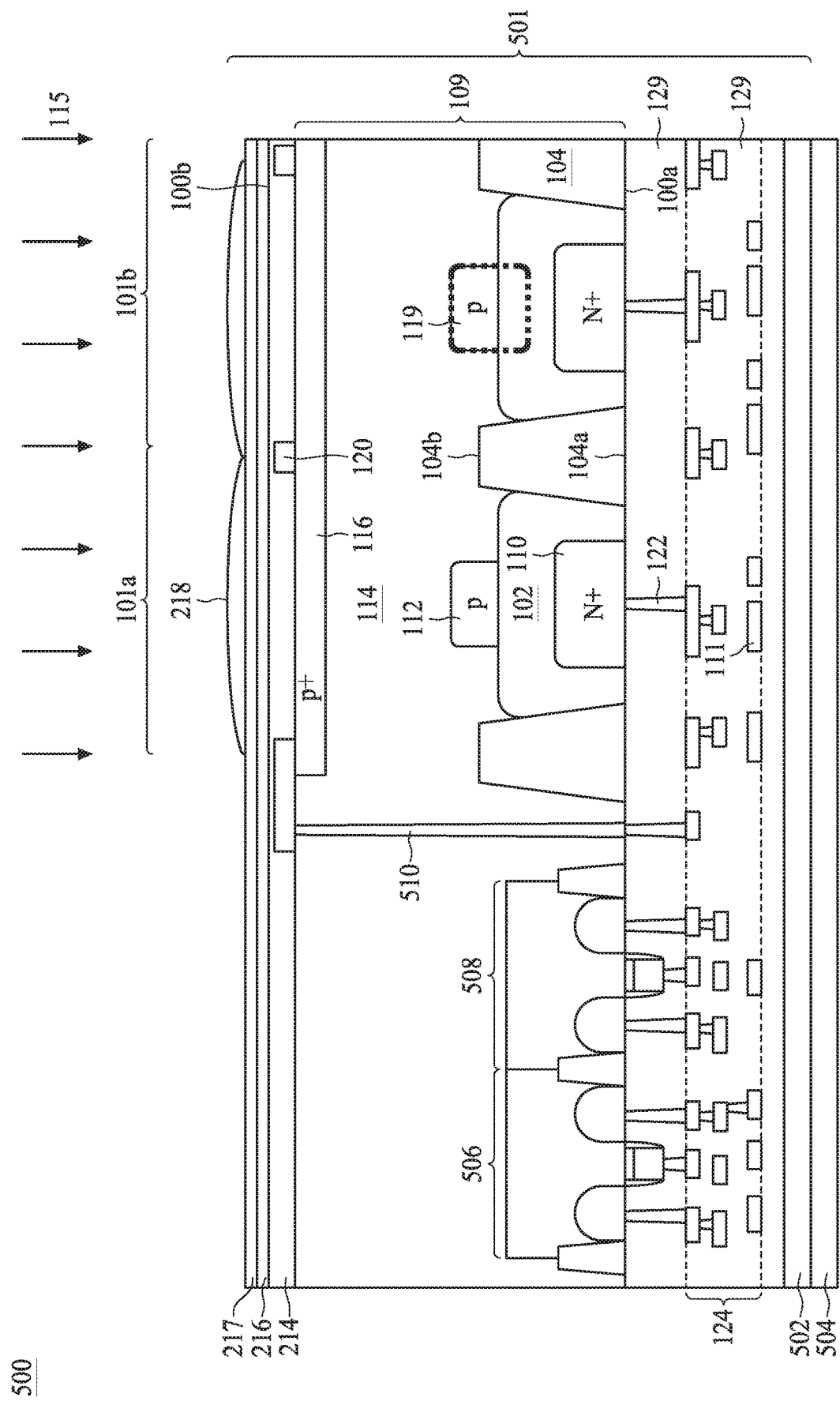
FIG. 5 is a diagram illustrating a cross-sectional view of a SPAD image sensor including an imaging chip in accordance with a fourth embodiment of the present disclosure.

In some embodiments, the imaging chip 101 may as well have a plurality of active devices in peripheral regions of the substrate 109 at around the array of pixels 101a to 101b as shown in FIG. 5 and being discussed in the subsequent paragraphs. For instance, a portion or all of the active quench circuit, the read circuit and other control or logic circuits mentioned above may be disposed in the substrate 109 of the imaging chip 101 instead of the CMOS chip 103.

In some embodiments, the SPAD image sensor 100 further includes a high-k dielectric layer 214 and/or an anti-reflective coating (ARC) layer 216 disposed over the back surface 100b of the substrate 109, configured to facilitate transmissions of the incident photons 115 from the back surface 100b to the SPAD cells 107. In some embodiments, the high-k dielectric layer 214 covers the common node 116 and the grid structure 120, and fills gaps between metal grid lines of the grid structure 120. The SPAD image sensor 100 may further include a color filter layer 217 over the ARC layer 216. For many instances, the color filter layer 217 contains a plurality of color filters positioned such that the incoming radiation is directed thereon and therethrough. The color filters includes a dye-based (or pigment based) polymer or resin for filtering a specific wavelength band of the incoming radiation, which corresponds to a color spectrum (e.g., red, green, and blue). A micro-lens layer 218 containing a plurality of micro-lenses is formed over the color filter layer 217. The micro-lenses 218 direct and focus the incoming radiation 115 toward the SPAD cells. The micro-lenses 218 may be positioned in various arrangements and have various shapes depending on a refractive index of a material used for the micro-lens 218 and distance from a sensor surface. For many instances, a center of each of the micro-lenses 218 overlaps a center of each of the corresponding SPAD cells from a top view.

Figure 2:
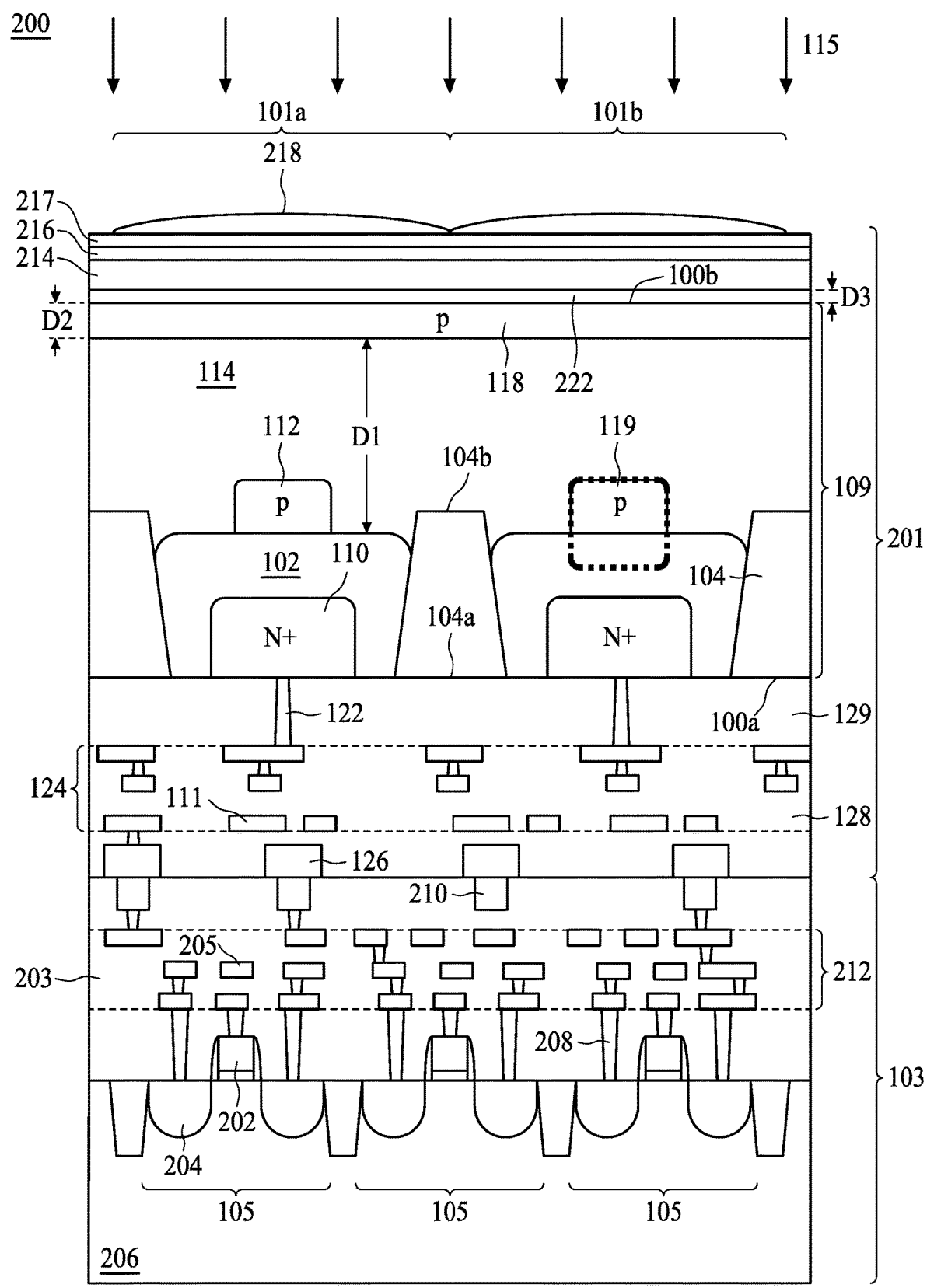
FIG. 2 is a diagram illustrating a cross-sectional view of a SPAD image sensor including the CMOS chip and an imaging chip bonded together in accordance with a second embodiment of the present disclosure.

FIG. 2 is a diagram illustrating a cross-sectional view of a SPAD image sensor 200 including the CMOS chip 103 and an imaging chip 201 bonded together in accordance with a second embodiment of the present disclosure. The imaging chip 201 is the same to the imaging chip 101 except a common node 118 of the imaging chip 201 may have a doping concentration lighter than or substantially the same to the common node 116 of the imaging chip 101. In some embodiments, the doping concentration of the common node 118 may be in a range from about 1e17/cm³ to about 5e18/cm³.

Another difference between the imaging chip 201 and the imaging chip 101 is that the imaging chip 201 includes a transparent conductive layer 222, such as an indium tin oxide (ITO) film, instead of the grid structure 120. The transparent conductive layer 222 is over the common node 118. In many instance, the transparent conductive layer 222 is in physical contact with the back surface 100b of the substrate 109. In some embodiments, a thickness D3 of the transparent conductive layer 222 may be about 1000 angstroms for better blue light sensitivity. In some embodiments for near-infra red (NIR) light application, the thickness D3 of the transparent conductive layer 222 may be about 5000 angstroms. The transparent conductive layer 222 collects holes absorbed by the common node 118. The holes may be drained to a reference voltage node or coupled to the active devices 105 of the CMOS chip 103 through a through substrate via (TSV) and contact plugs at a peripheral region in the imaging chip 101 around the pixels 101a and 101b.

Figure 3:
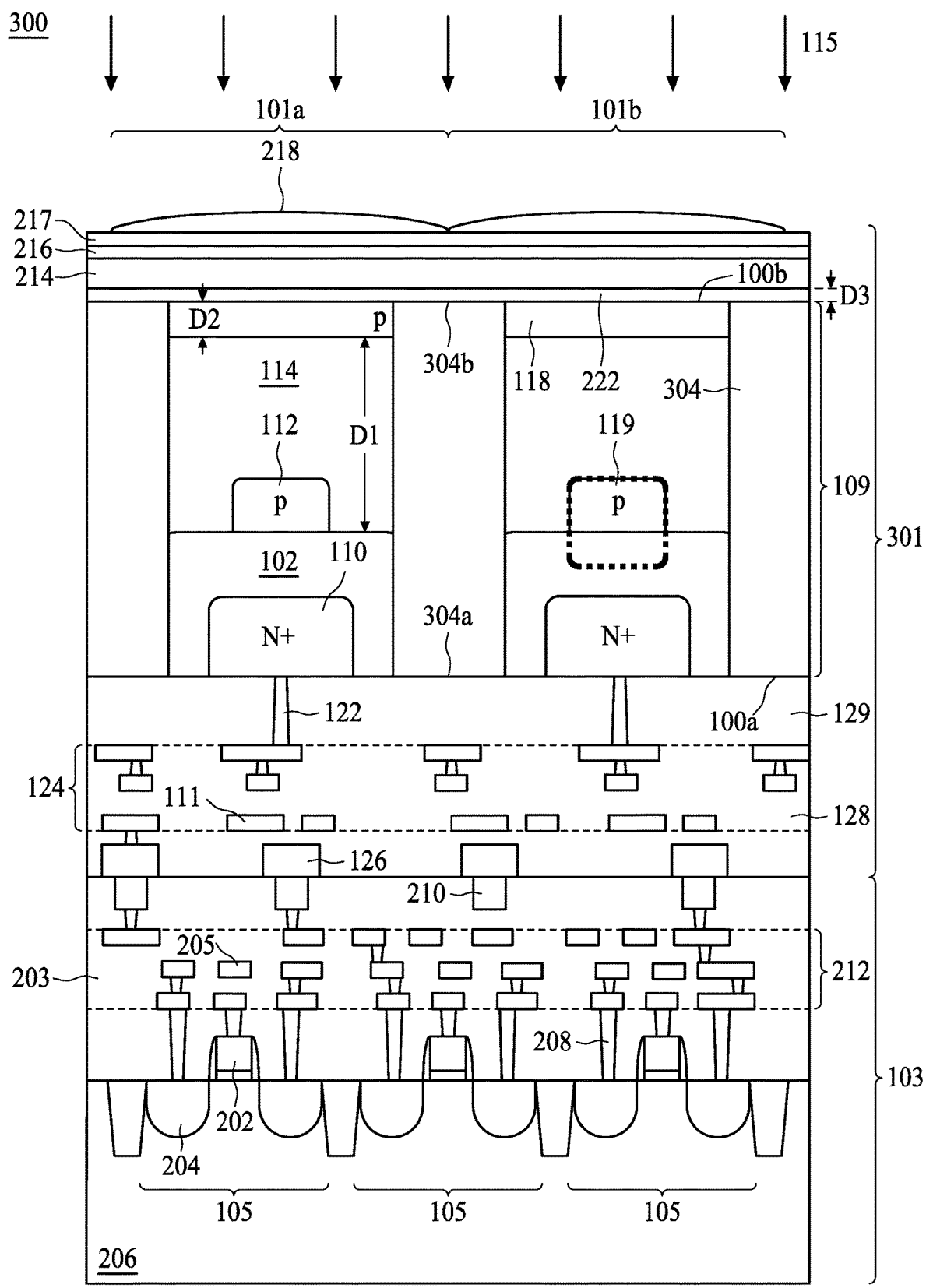
FIG. 3 is a diagram illustrating a cross-sectional view of a SPAD image sensor including the CMOS chip and an imaging chip bonded together in accordance with a third embodiment of the present disclosure.
Figure 4:
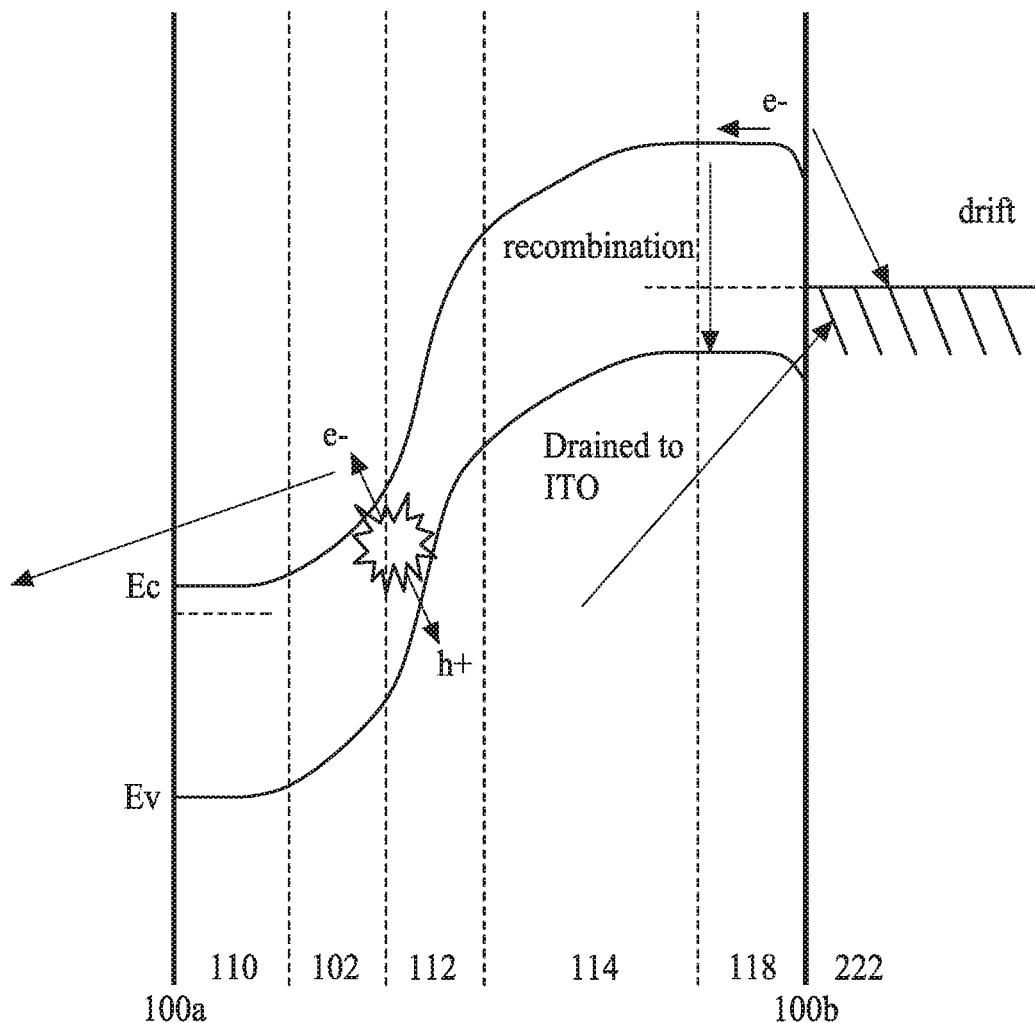
FIG. 4 is a diagram illustrating a band diagram for portions of the embodiments illustrated in FIGS. 2 and 3.

FIG. 3 is a diagram illustrating a cross-sectional view of a SPAD image sensor 300 including the CMOS chip 103 and an imaging chip 301 bonded together in accordance with a third embodiment of the present disclosure. The imaging chip 301 is the same to the imaging chip 201 except trench isolations 304 of the imaging chip 301 are different from the trench isolations 104 of the imaging chip 101. The trench isolations 304 extend from the front surface 100a, pass through the common node 118 and to the back surface 100b. In more particular, a first surface 304a of the trench isolations 304 is level with the front surface 100a, and a second surface 304b of the trench isolation 304 is level with the back surface 100b. In many instances, the trench isolation 304 may have an elongated rectangular profile as shown in FIG. 1. However, this is not a limitation of the present disclosure. In many instances, the trench isolation 304 may have a trapezoidal profile. The trench isolation 304 is more effective on prevention of crosstalk between adjacent pixels FIG. 4 is a diagram illustrating a band diagram for portions of the embodiments illustrated in FIGS. 2 and 3. In particular, FIG. 4 shows the band diagram of the transparent conductive layer 222 (here is an ITO film for illustration) and the substrate 109, including the sensing node 110, the second layer 102, the third layer 112, the first layer 114 and the common node 118. When the breakdown successfully happens at the breakdown region 119 around the second layer 102 and the third layer 112, electrons flow to the sensing node 110 and are collected by the sensing node 110, and holes are absorbed by the common node 118 and drained to the ITO film. The Fermi level in the ITO film is lower than a conduction band $E_C$ and higher than a valence band $E_V$ of the first layer 114 and the common node 118. As such, the electrons are more unlikely to be trapped at the back surface 100b of the substrate 109 through the potential design and charge recombination.

As mentioned above, the imaging chip 101 may as well have a plurality of active devices in peripheral regions of the substrate 109 at around the array of pixels 101a to 101b. For instance, a portion or all of the active quench circuit, the read circuit and other control or logic circuits mentioned above may be disposed in the substrate 109 of the imaging chip 101 instead of the CMOS chip 103. For many instances, all of the active quench circuit, the read circuit and other control or logic circuits and the pixels are integrated in the same substrate and the CMOS chip 103 may be omitted. FIG. 5 is a diagram illustrating a cross-sectional view of a SPAD image sensor 500 including an imaging chip 501 in accordance with a fourth embodiment of the present disclosure. The imaging chip 501 is the same to the imaging chip 101 except the imaging chip 501 is bonded to a carrier substrate 504 through a buffer layer 502. The buffer layer 502 may include a dielectric material such as silicon oxide. Alternatively, the buffer layer 502 may optionally include silicon nitride.

The carrier substrate 504 may include a silicon material. Alternatively, the carrier substrate 504 may include a glass substrate or other suitable materials. The carrier substrate 504 may be bonded to the buffer layer 502 by molecular forces, i.e., a technique known as direct bonding or optical fusion bonding, or by other bonding techniques known in the art, such as metal diffusion or anodic bonding. The buffer layer 502 provides electrical isolation and protection for the various features formed on the front surface 100a of the substrate 109. The carrier substrate 504 also provides mechanical strength and support for processing the SPAD image sensor 500. In some embodiments, a plurality of active devices 506 and 508 may be integrated in the imaging chip 501. The active devices may be formed in the substrate 109 around the array of pixels 101a to 101b. For instance, the active devices 506 and 508 may include the active quench circuit, the read circuit and other control or logic circuits. In some embodiments, a through substrate via (TSV) 510 passing through the substrate 109 may be used for draining holes to the front side of the substrate 109.

Figure 6:
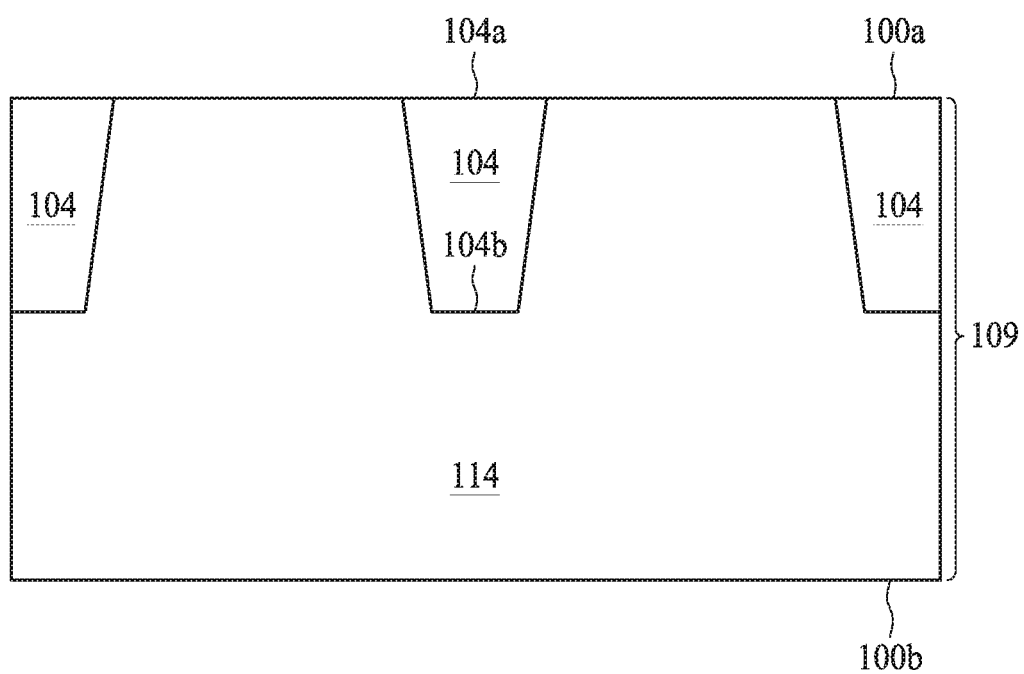
FIG. 6 to FIG. 11 are diagrams illustrating fragmentary cross-sectional views of the SPAD image sensor of FIG. 1 at various stages of fabrication in accordance with a preferred embodiment of the disclosure.

FIG. 6 to FIG. 11 are diagrams illustrating fragmentary cross-sectional views of the SPAD image sensor 100 at various stages of fabrication in accordance with a preferred embodiment of the disclosure. It is understood that FIG. 6 to FIG. 11 have been simplified for a better understanding of the inventive concepts of the present disclosure and may not be drawn to scale. With reference to FIG. 6, the substrate 109 is provided. The substrate 109 includes the first layer 114. The first layer 114 may be doped with dopants of the first conductivity type, and has the dopant concentration at a level of about 1e16/cm³. The first layer 114 extends from the front surface 100a to the back surface 100b of the substrate 109. Trench isolations 104 are formed in the first layer 114 at the front surface 100a and respectively has a trapezoidal shape, somewhat a rectangular shape, or another suitable shape. Each of the trench isolations 104 has the first surface 104a and the second surface 104b.

Figure 7:
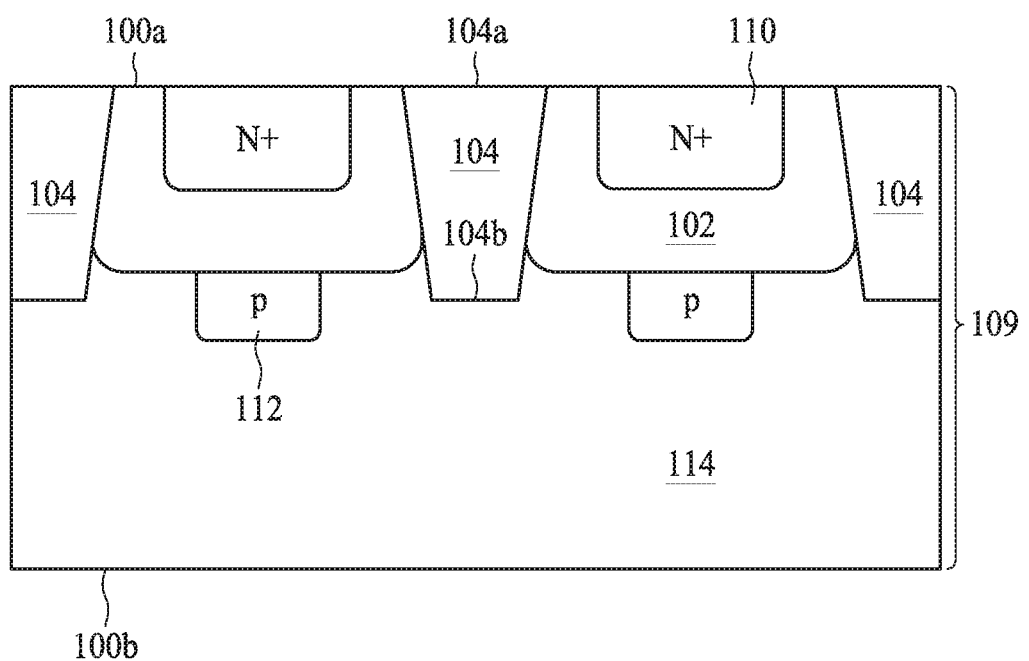

With reference to FIG. 7, an ion implantation may be performed upon the front surface 100a of the substrate 109 with dopants of the second conductivity type, for instance, the n type dopant, opposite to the conductivity type of the first layer 114 to form the second layer 102. The dopant concentration of the second layer 102 may be at a level of about 1e17/cm³ to about 1e19/cm³. The second layer 102 is between the trench isolations 104. In particular, the second layer 102 extends from the front surface 100a of the substrate 109 toward the back surface 100b of the substrate 109, and not exceeding the second surface 104b of the trench isolations 104. In other words, the second layer 102 immediately abuts at least a portion of sidewalls of the trench isolations 104.

Subsequent to the second layer 102, the third layer 112 and the sensing node 110 may be formed by ion implantation as well. The third layer 112 may be doped with dopants of the first conductivity type, e.g., p type, the same to the conductivity type of the first layer 114. The dopant concentration of the third layer 112 may be heavier than the dopant concentration of the first layer 114. In some embodiments, a ratio of the dopant concentration of the third layer 112 to the dopant concentration of the first layer 114 may be in a range from about 1 to about 100. In an embodiment, the dopant concentration of the third layer 112 may be at a level of about 1e17/cm³. The third layer 112 is formed in the first layer 114 and immediately abuts the second layer 102. In particular, the third layer 112 is formed within the first layer 114 and is encompassed by the first layer 114. The sensing node 110 may be heavily doped with dopants of the second conductivity type, e.g., n type, the same to the conductivity type of the second layer 102. The dopant concentration of the sensing node 110 may be heavier than the dopant concentration of the second layer 102. In some embodiments, a ratio of the dopant concentration of the sensing node 110 to the dopant concentration of the second layer 102 may be in a range from about 10 to about 1000. In an embodiment, the dopant concentration of the sensing node 110 may be at a level of about 1e20/cm³. The sensing node 110 is formed in the substrate 109 and immediately abuts the front surface 100*a* of the substrate 109. In particular, the sensing node 110 is formed within the second layer 102 and is encompassed by the second layer 102.

Figure 8:
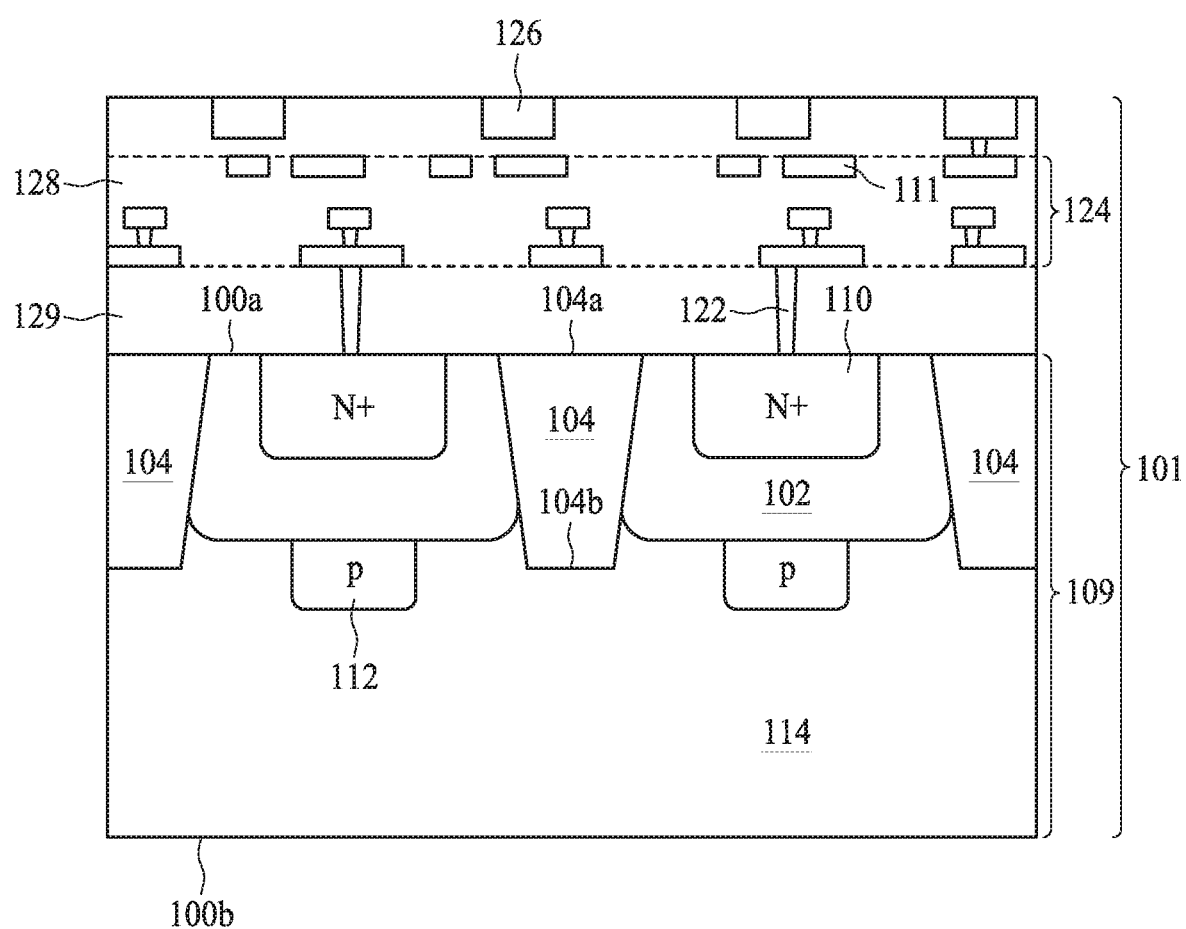

With reference to FIG. 8, the contact plugs 122 are formed for the sensing node 110. In some embodiments, the contact plugs 122 may be formed by forming a dielectric layer 129 over the front surface 100*a* of the substrate 109. The dielectric layer 129 is subsequently etched to form via holes and/or metal trenches. The via holes and/or metal trenches are then filled with a conductive material to form the contact plugs 122. In some embodiments, the contact plugs 122 may be comprised of tungsten, copper, or aluminum copper, for example. The interconnect structure 124 is formed over the substrate 109, forming the imaging chip 101. In some embodiments, the interconnect structure 124 may be formed by forming the ILD layer 128, which includes one or more layers of ILD material, over the dielectric layer 129. The ILD layer 128 is subsequently etched to form via holes and/or metal trenches. The via holes and/or metal trenches are then filled with a conductive material to form the plurality of metal layers 111. In some embodiments, the ILD layer 128 may be deposited by a physical vapor deposition technique (e.g., PVD, CVD, etc.). The plurality of metal layers 111 may be formed using a deposition process and/or a plating process (e.g., electroplating, electro-less plating, etc.). In various embodiments, the plurality of metal layers 111 may be comprised of tungsten, copper, or aluminum copper, for example. In some embodiments, a top metal layer 126 of the plurality of metal layers 111 has an upper surface aligned with an upper surface of the ILD layer 128.

Figure 9:
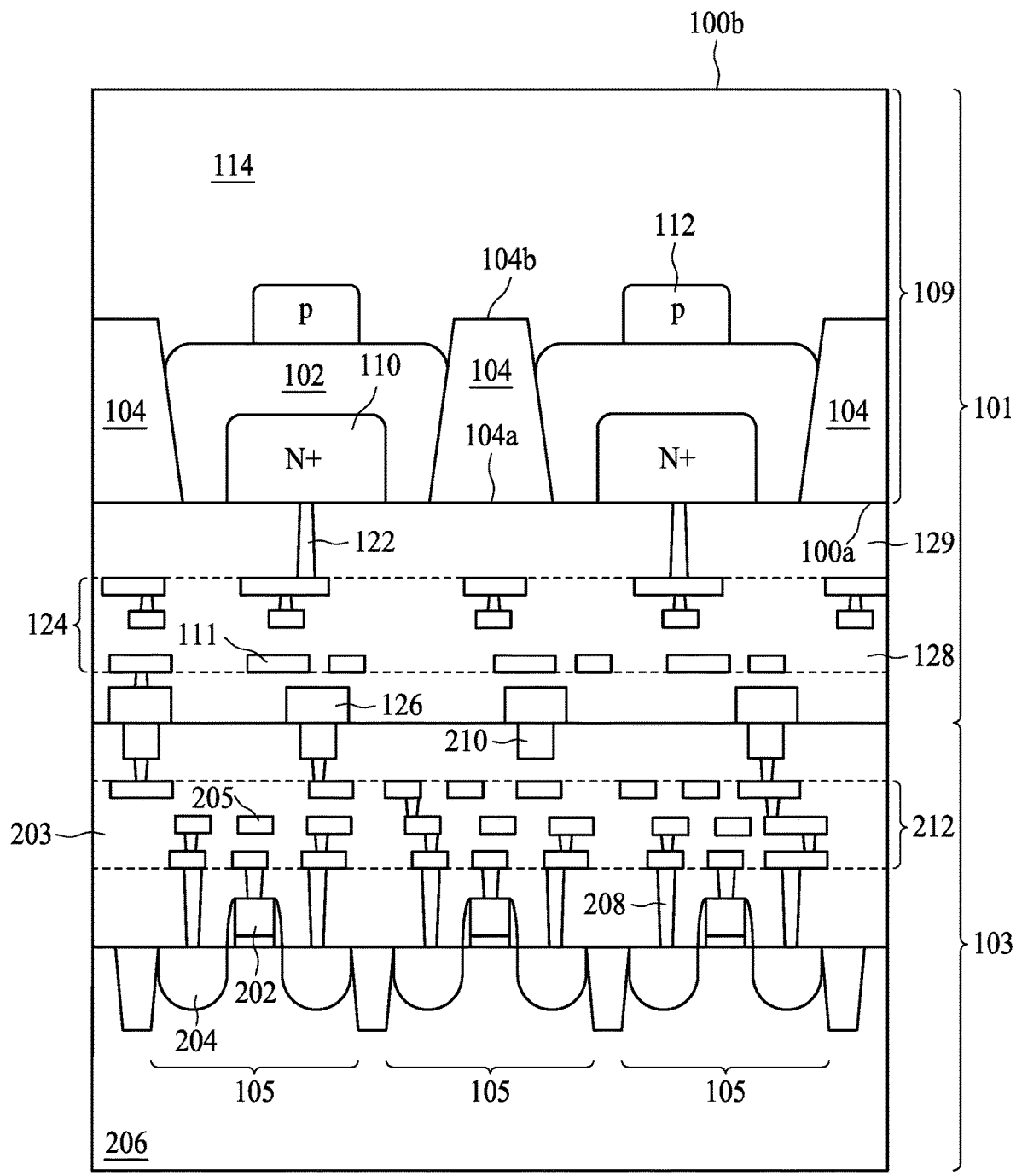

With reference to FIG. 9, the imaging chip 101 is bonded to the CMOS chip 103. The CMOS chip 103 includes the substrate 206. The active devices 105 are formed within the substrate 206. In various embodiments, the substrate 206 may include any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. In some embodiments, the active devices 105 may include transistors formed by depositing the gate structure 202 over the substrate 206 and forming the source/drain regions 204 by implantation or epitaxial growth. The interconnect structure 212 is formed over the substrate 206, to form the CMOS chip 103. In some embodiments, the interconnect structure 212 may be formed by forming the ILD layer 203, which includes one or more layers of ILD material, over the substrate 206. The ILD layer 203 is subsequently etched to form via holes and/or metal trenches. The via holes and/or metal trenches are then filled with a conductive material to form the plurality of metal layers 205. In some embodiments, the ILD layer 203 may be deposited by a physical vapor deposition technique (e.g., PVD, CVD, etc.). The metal layers 205 may be formed using a deposition process and/or a plating process (e.g., electroplating, electro-less plating, etc.). In various embodiments, the plurality of metal layers 205 may be comprised of tungsten, copper, or aluminum copper, for example. In some embodiments, the top metal layer 210 of the plurality of metal layers 205 has an upper surface aligned with an upper surface of the ILD layer 203.

In some embodiments, the bonding process may form a hybrid bond including a metal-to-metal bond and a dielectric-to-dielectric bond. The top metal layer 210 and the top metal layer 126 can be bonded together in direct. The ILD layer 128 and the ILD layer 203 can abut one another to define a dielectric-to-dielectric bond of the hybrid bond. In some embodiments, the dielectric-to-dielectric bond is an oxide-to-oxide bond. In some other embodiments, the bonding process may use an intermediate bonding oxide layer (not shown) arranged between the ILD layer 128 and the ILD layer 203.

Figure 10:
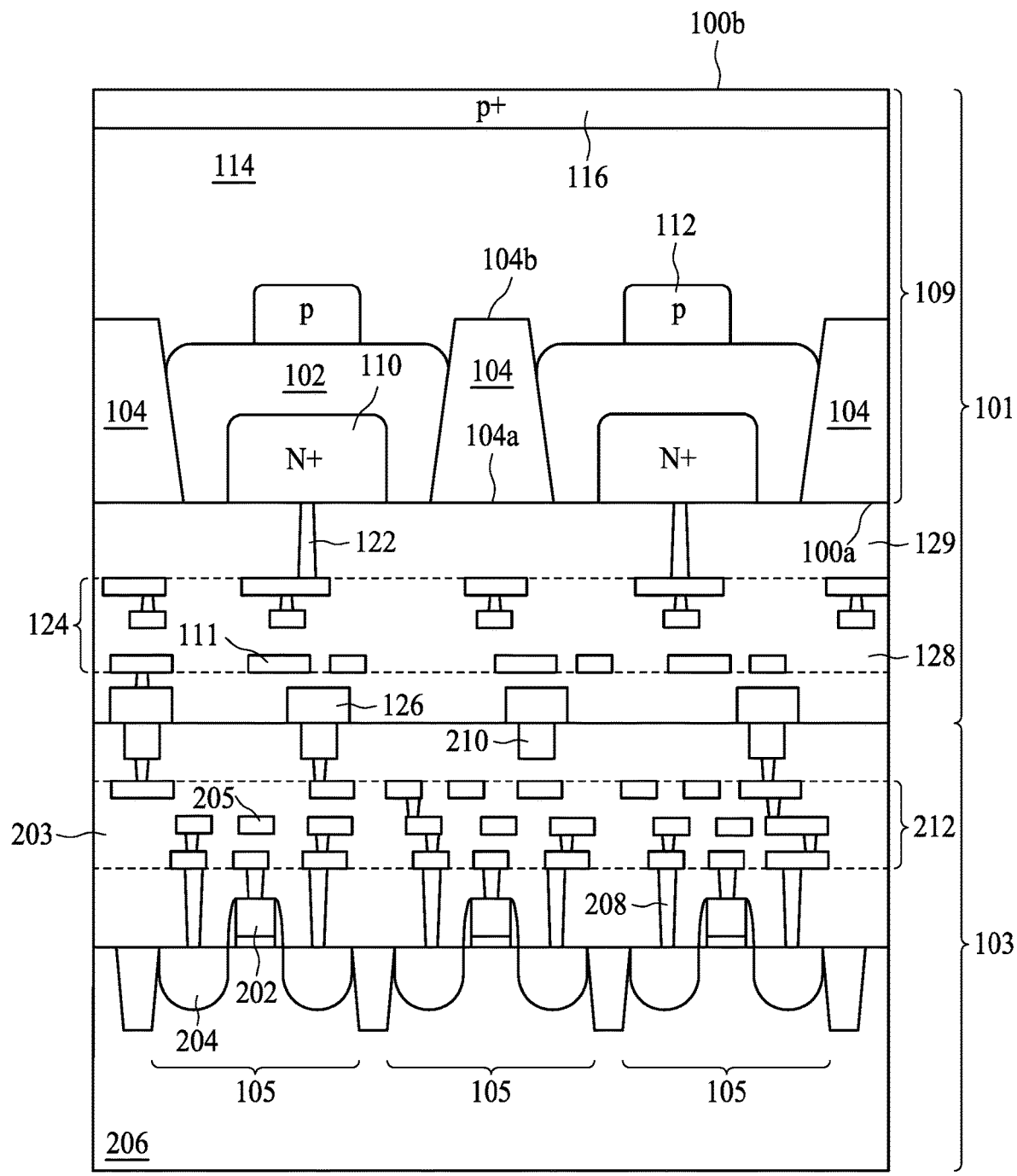
Figure 11:
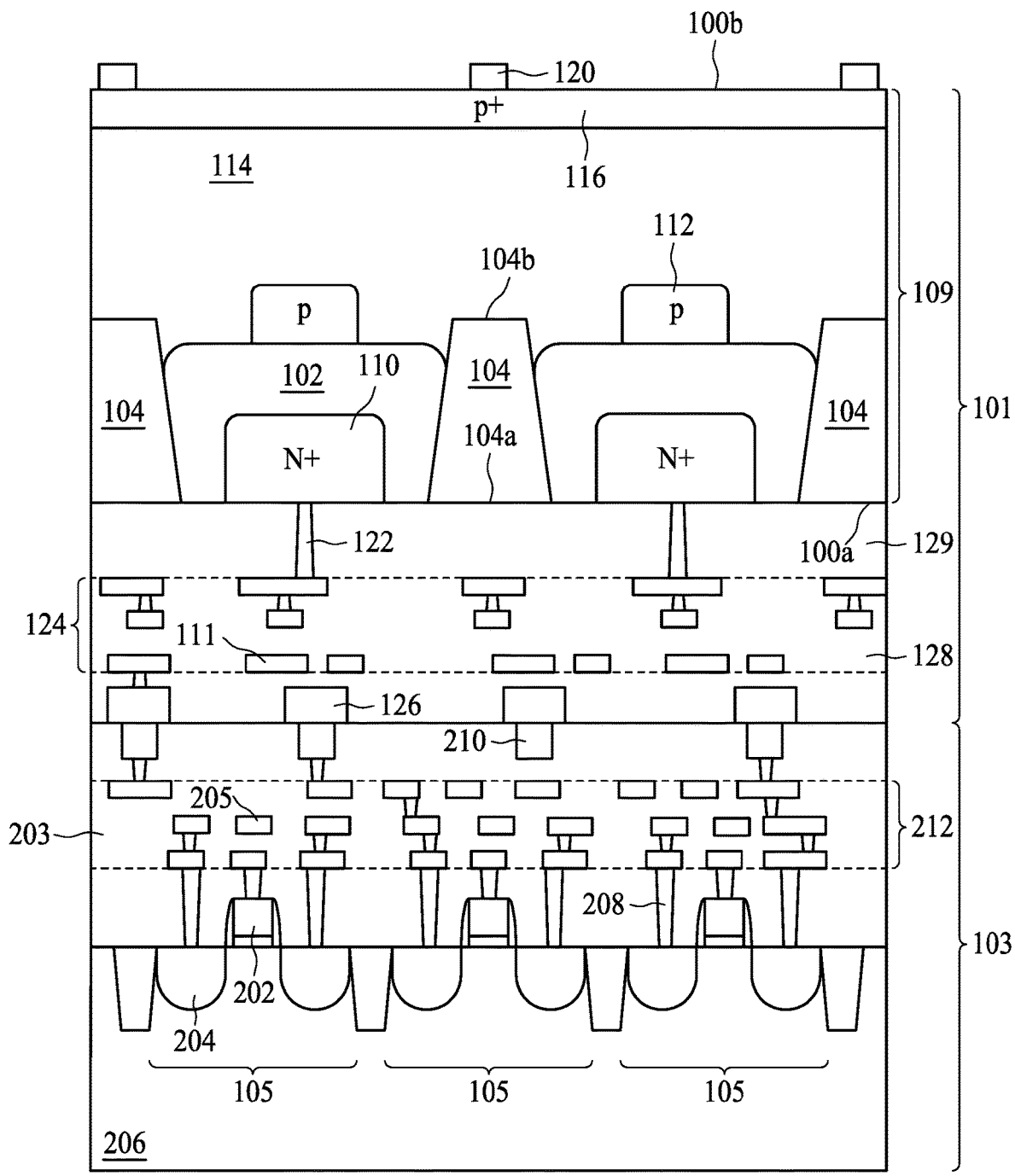

With reference to FIG. 10, an etching may be performed, incorporating etchant such as acidic solution, to remove a portion of the substrate 109 from the back surface 100*b*. In other embodiments, the substrate 109 may be thinned by mechanical grinding the back surface 100 of the substrate 109. An ion implantation and thermal anneal are sequentially performed on the back surface 100*b* of the slightly thinned substrate 109, thereby forming the common node 116. Next, as shown in FIG. 11, the grid structure 120 is formed on the common node 116 using a suitable deposition process such as CVD, PECVD, ALD, electroplating and/or the like.

Referring back to FIG. 1, the high-k dielectric layer 214 is formed over the back surface 100*b* of the substrate 109 to encapsulate the grid structure 120. An ARC layer 216 can be formed over the high-k dielectric layer 214. In some embodiments, the high-k dielectric layer 214 and the ARC layer 216 may be deposited using a physical vapor deposition technique.

The color filters 217 can be formed over the back surface 100*b* of the substrate 109. In some embodiments, the color filters 217 may be formed by forming a color filter layer and patterning the color filter layer. The color filter layer is formed of a material that allows for the transmission of radiation (e.g., light) having a specific range of wavelength, while blocking light of wavelengths outside of the specified range. Further, in some embodiments, the color filter layer is planarized subsequent to formation. The micro-lenses 218 can also be formed over the color filters 217. In some embodiments, the micro-lenses 218 may be formed by depositing a micro-lens material above the plurality of color filters (e.g., by a spin-on method or a deposition process). A micro-lens template (not shown) having a curved upper surface is patterned above the micro-lens material. In some embodiments, the micro-lens template may include a photoresist material exposed using a distributing exposing light dose (e.g., for a negative photoresist more light is exposed at a bottom of the curvature and less light is exposed at a top of the curvature), developed and baked to form a rounding shape. The micro-lenses 218 are then formed by selectively etching the micro-lens material according to the micro-lens template.

Figure 12:
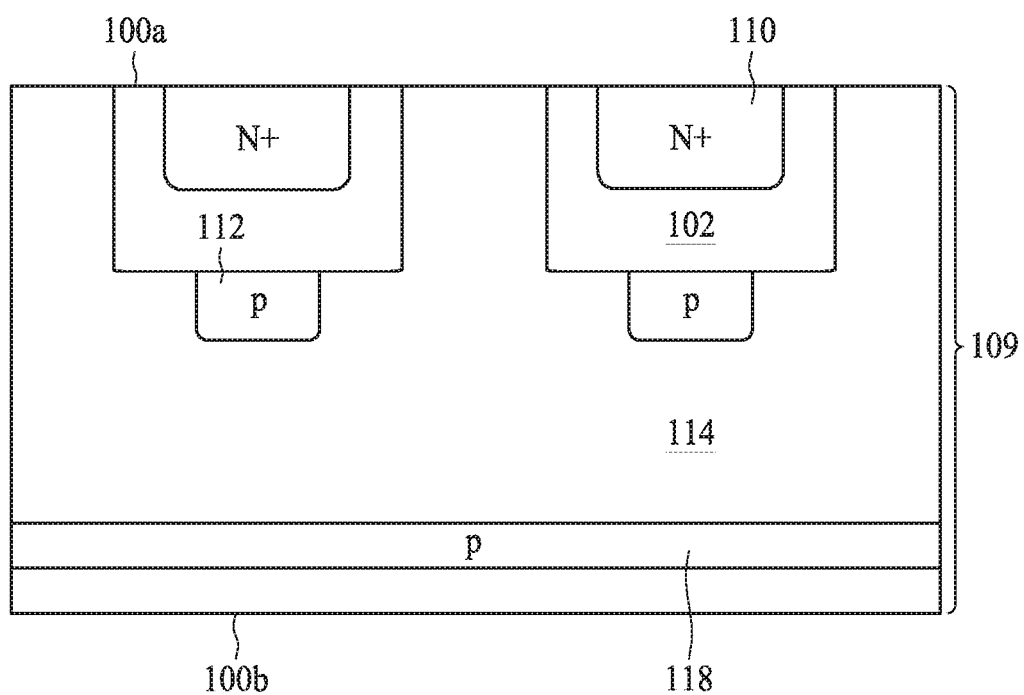
FIG. 12 to FIG. 16 are diagrams illustrating fragmentary cross-sectional views of the SPAD image sensor of FIG. 3 at various stages of fabrication in accordance with a preferred embodiment of the disclosure.

FIG. 12 to FIG. 16 are diagrams illustrating fragmentary cross-sectional views of the SPAD image sensor 300 at various stages of fabrication in accordance with a preferred embodiment of the disclosure. It is understood that FIG. 12 to FIG. 16 have been simplified for a better understanding of the inventive concepts of the present disclosure and may not be drawn to scale. With reference to FIG. 12, the substrate 109 is provided and then an ion implantation may be performed upon the front surface 100a of the substrate 109 to form the second layer 102, the third layer 112, and the sensing node 110 in a manner substantially the same or similar to FIG. 7. Further, an ion implantation may be performed upon the front surface 100a or the back surface 100b of the substrate 109 to form the common node 118 in the substrate 109 between the third layer 112 and the back surface 100b.

Figure 13:
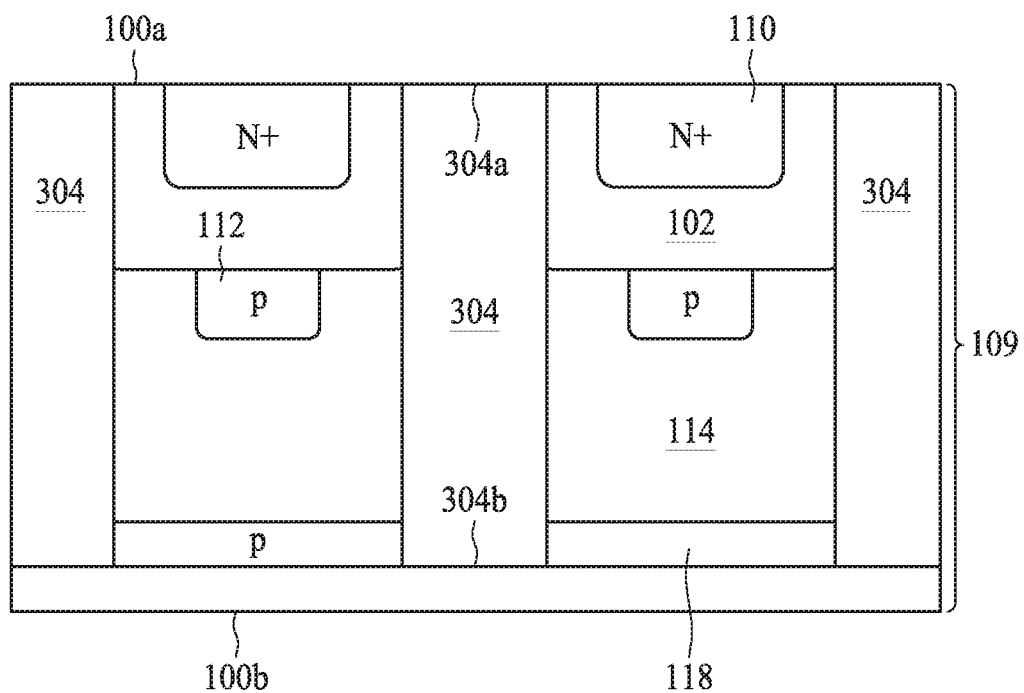
Figure 14:
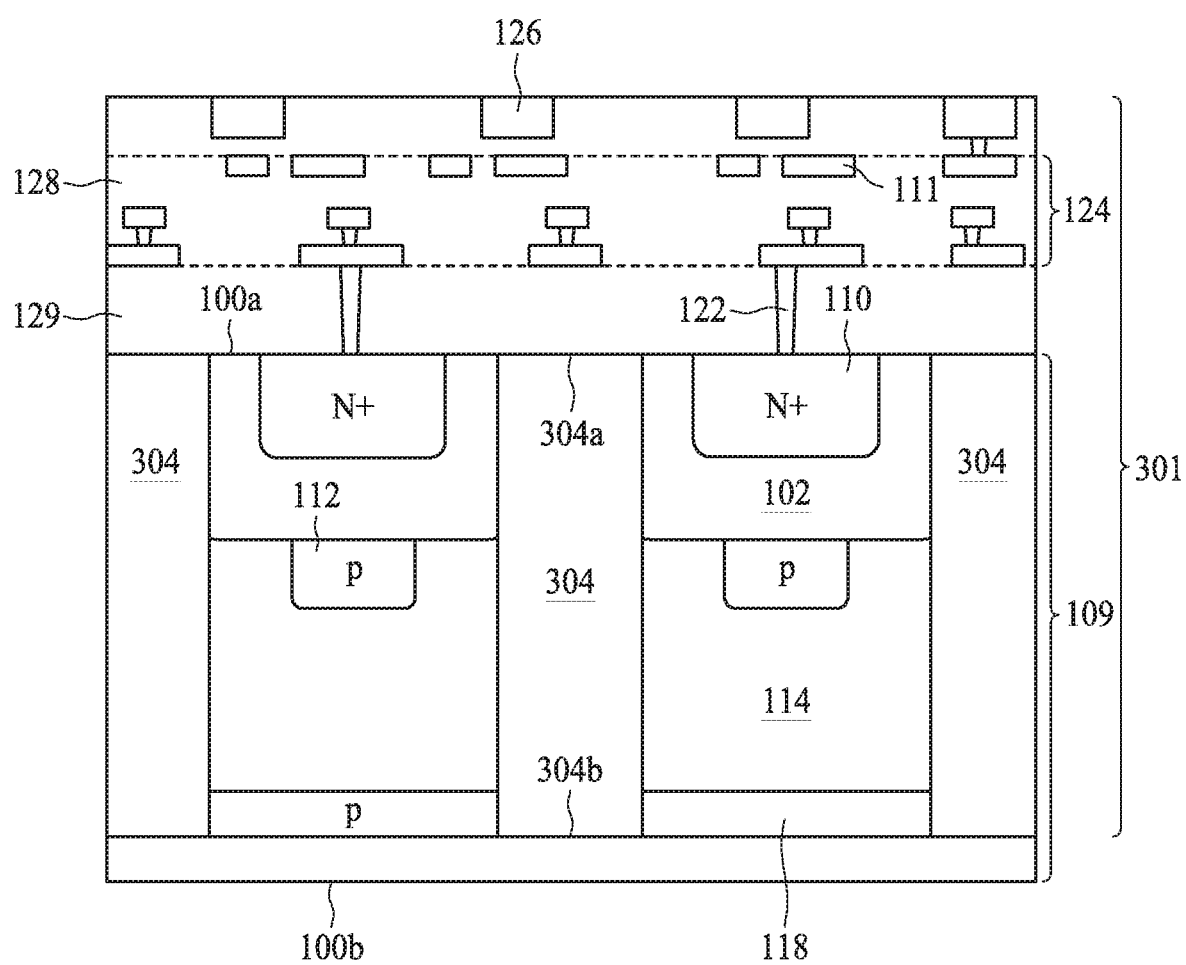
Figure 15:
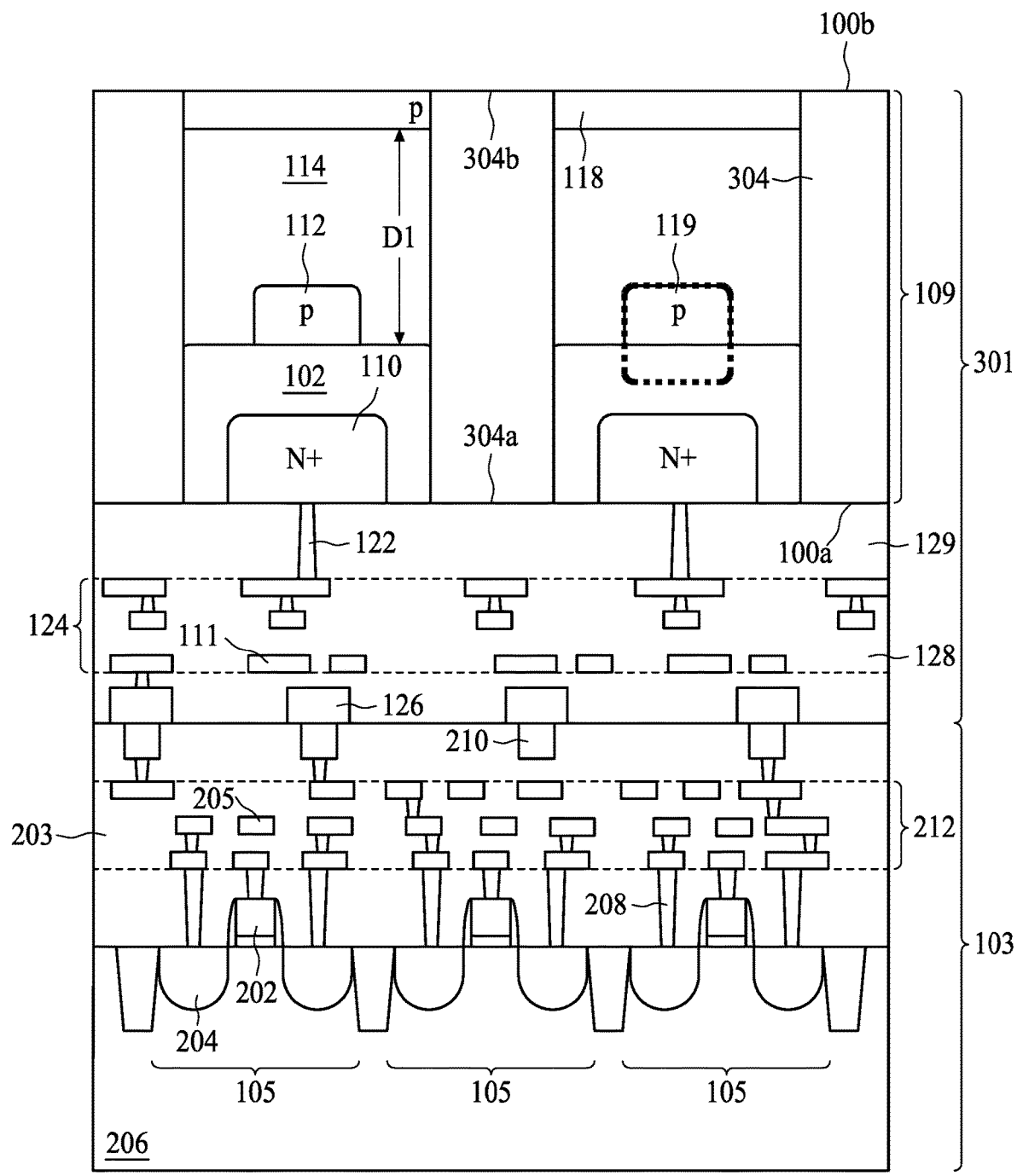
Figure 16:
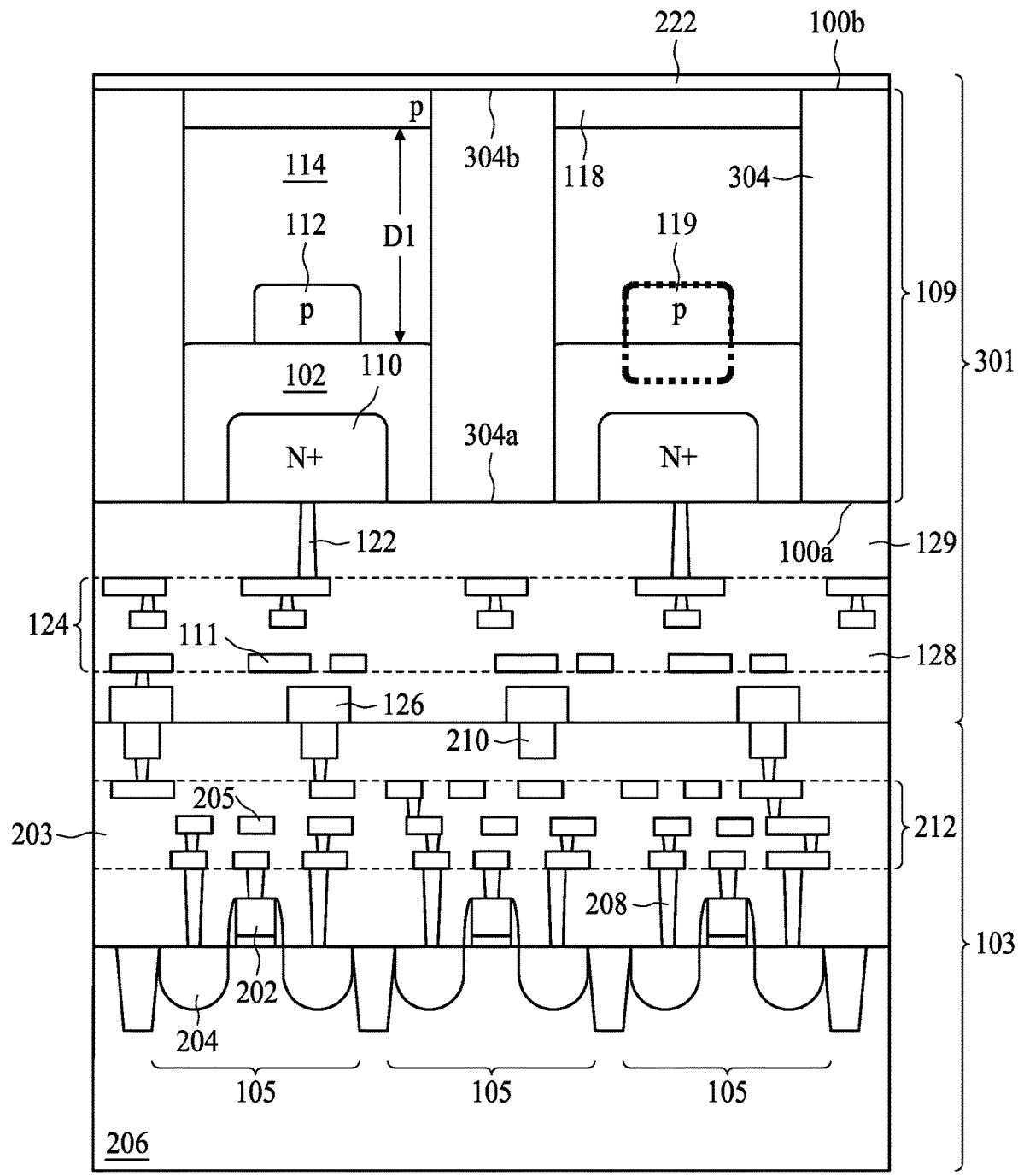

With reference to FIG. 13, trench isolations 304 are formed in the substrate 109 to pass through the substrate 109 from the front surface 100a through the back surface 100b. With reference to FIG. 14, the contact plugs 122 and the interconnect structure 124 are formed in a manner substantially the same or similar to FIG. 8 in order to form the imaging chip 301. With reference to FIG. 15, the imaging chip 301 is bonded to the CMOS chip 103 in a manner substantially the same or similar to FIG. 9. As shown in FIG. 16, the transparent conductive layer 222 is next formed atop the back surface 100b of the substrate 109. The bottom surface of the transparent conductive layer 222 may be in contact with the back surface 100b of the substrate 109 and the trench isolations 304. In subsequent processes, overlying structures such as the high-k dielectric layer 214, the ARC layer 216, the color filters 217 and micro-lenses 218, or the like, are formed to obtain the SPAD image sensor 300 of FIG. 3.

Some embodiments of the present disclosure provide a single photon avalanche diode (SPAD) image sensor. The SPAD image sensor includes: a substrate having a front surface and a back surface; wherein the substrate includes a sensing region, and the sensing region includes: a common node heavily doped with dopants of a first conductivity type, the common node being within the substrate and abutting the back surface of the substrate; a sensing node heavily doped with dopants of a second conductivity type opposite to the first conductivity type, the sensing node being within the substrate and abutting the front surface of the substrate; and a first layer doped with dopants of the first conductivity type between the common node and the sensing node.

Some embodiments of the present disclosure provide a single photon avalanche diode (SPAD) image sensor. The SPAD image sensor includes: a substrate having a front surface and a back surface; and a transparent conductive layer at the back surface of the substrate; wherein the substrate includes a sensing region, and the sensing region includes: a common node doped with dopants of a first conductivity type, the common node being within the substrate and abutting the back surface of the substrate; a sensing node heavily doped with dopants of a second conductivity type opposite to the first conductivity type, the sensing node being within the substrate and abutting the front surface of the substrate; and a first layer doped with dopants of the first conductivity type between the common node and the sensing node.

Some embodiments of the present disclosure provide a method of fabricating a single photon avalanche diode (SPAD) image sensor. The method includes: receiving a substrate having a front surface and a back surface, wherein the substrate has a first layer doped with dopants of a first conductivity type extending from the front surface to the back surface of the substrate; performing an ion implantation upon the front surface of the substrate with dopants of a second conductivity type opposite to the first conductivity type to form a sensing node within the first layer; and performing an ion implantation upon the back surface of the substrate with dopants of the first conductivity type to form a common node.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A single photon avalanche diode (SPAD) image sensor, comprising:
   a substrate having a front surface and a back surface;
   wherein the substrate includes a sensing region, and the sensing region includes:
      a common node heavily doped with dopants of a first conductivity type, the common node being within the substrate and abutting the back surface of the substrate;
      a sensing node heavily doped with dopants of a second conductivity type opposite to the first conductivity type, the sensing node being within the substrate and abutting the front surface of the substrate;
      a first layer doped with dopants of the first conductivity type, the first layer abutting the common node and free from abutting the front surface of the substrate;
      a second layer doped with dopants of the second conductivity type, the second layer abutting the front surface of the substrate and covering the sensing node, and the second layer being free from abutting the back surface of the substrate; and
      a trench isolation extending from the front surface of the substrate toward the back surface of the substrate;
      wherein the front surface of the substrate is free from including dopants of the first conductivity type, and the second layer fully fills a gap between the sensing node and the trench isolation at the front surface of the substrate.

2. The SPAD image sensor of claim 1, wherein the substrate further comprises:
   a third layer doped with dopants of the first conductivity type, the third layer being within the first layer and abutting the second layer.

3. The SPAD image sensor of claim 2, wherein a ratio of a dopant concentration of the common node to a dopant concentration of the third layer is in a range from about 10 to about 1000.

4. The SPAD image sensor of claim 1, wherein the common node is a continuous layer covering the sensing region.

5. The SPAD image sensor of claim 1, wherein a thickness of the common node is less than about 0.5 µm.

6. The SPAD image sensor of claim 1, further comprising a grid structure including metal grid lines on the back surface of the substrate.

7. The SPAD image sensor of claim 6, further comprising a dielectric layer at the back surface of the substrate, the dielectric layer covering the common node and the grid structure, and filling gaps between metal grid lines of the grid structure.

8. The SPAD image sensor of claim 7, further comprising a lens at the back surface of the substrate over the dielectric layer.

9. The SPAD image sensor of claim 1, further comprising a chip including a plurality of active devices, wherein the chip is bonded to the front surface of the substrate.

10. The SPAD image sensor of claim 1, wherein the substrate further comprises a peripheral region around the sensing region, and the peripheral region includes a plurality of active devices.

11. A single photon avalanche diode (SPAD) image sensor, comprising:
   a substrate having a front surface and a back surface; and
   wherein the substrate includes a sensing region, and the sensing region includes:
      a common node doped with dopants of a first conductivity type, the common node being within the substrate and abutting the back surface of the substrate;
      a sensing node heavily doped with dopants of a second conductivity type opposite to the first conductivity type, the sensing node being within the substrate and abutting the front surface of the substrate;
      a trench isolation extending from the front surface of the substrate toward the back surface of the substrate, the trench isolation having a first surface and a second surface opposite to the first surface, the first surface being level with the front surface of the substrate, and the second surface being distanced from the back surface of the substrate by a distance greater than 0;
      a first layer doped with dopants of the first conductivity type, the first layer abutting the common node and free from abutting the front surface of the substrate; and
      a second layer doped with dopants of the second conductivity type, the second layer abutting the front surface of the substrate and covering the sensing node, and the second layer being free from abutting the back surface of the substrate;
   wherein the second layer fully fills a gap between the sensing node and the trench isolation at the front surface of the substrate.

12. The SPAD image sensor of claim 11, wherein a distance between the common node and the second layer is greater than about 1 μm.

13. The SPAD image sensor of claim 11, further comprising a first inter-layer dielectric (ILD) layer at the front surface of the substrate, the first ILD layer including a plurality of metal layers.

14. The SPAD image sensor of claim 13, further comprising a chip, the chip including a plurality of active devices and a second inter-layer dielectric (ILD) layer, and the chip being bonded to the first ILD layer through the second ILD layer.

15. A single photon avalanche diode (SPAD) image sensor, comprising:
   a first pixel and a second pixel arranged in a substrate, the substrate having a front surface and a back surface, and each of the first pixel and the second pixel including:
      a first layer doped with dopants of a first conductivity type, the first layer being within the substrate and abutting the back surface of the substrate;
      a second layer doped with dopants of a second conductivity type opposite to the first conductivity type, the second layer being within the substrate and between the front surface of the substrate and the first layer, the second layer abutting the front surface of the substrate and free from abutting the back surface of the substrate;
      a third layer doped with dopants of the first conductivity type, the third layer being within the first layer and abutting the second layer;
      a sensing node doped with dopants of the second conductivity type, the sensing node being within the second layer; and
      a common node doped with dopants of the first conductivity type, the common node being within the substrate and abutting the back surface of the substrate; and
   an isolator between the first pixel and the second pixel;
   wherein the common node of the first pixel and the common node of the second pixel together form a continuous layer, and the isolator extends from the front surface of the substrate toward the back surface of the substrate, the isolator having a first surface and a second surface opposite to the first surface, the first surface being coplanar with the front surface of the substrate, and the second surface being distanced from the continuous layer by a distance greater than 0;
   wherein the second layer fully fills a gap between the sensing node and the isolator at the front surface of the substrate.

16. The SPAD image sensor of claim 15, wherein a doping concentration of the common node is in a range from about 1e17/cm$^3$ to about 5e18/cm$^3$.

17. The SPAD image sensor of claim 15, wherein the first conductivity type is p type and the second conductivity type is n type.

18. The SPAD image sensor of claim 15, further comprising a grid structure including metal grid lines on the back surface of the substrate.

19. The SPAD image sensor of claim 18, further comprising a dielectric layer at the back surface of the substrate, the dielectric layer covering the common node and the grid structure, and filling gaps between the metal grid lines of the grid structure.

20. The SPAD image sensor of claim 15, wherein a ratio of a dopant concentration of the common node to a dopant concentration of the third layer is in a range from about 10 to about 1000.

* * * * *